(12) United States Patent
Greim

(10) Patent No.: US 9,244,141 B2
(45) Date of Patent: Jan. 26, 2016

(54) INTEGRATED SHEATH CURRENT FILTER IN A LOCAL COIL

(75) Inventor: Helmut Greim, Adelsdorf (DE)

(73) Assignee: Siemens Aktiengesellschaft, München (DE)

( * ) Notice: Subject to any disclaimer, the term of this patent is extended or adjusted under 35 U.S.C. 154(b) by 698 days.

(21) Appl. No.: 13/553,623

(22) Filed: Jul. 19, 2012

(65) Prior Publication Data

US 2013/0181716 A1    Jul. 18, 2013

(30) Foreign Application Priority Data

Jul. 21, 2011    (DE) .......................... 10 2011 079 596

(51) Int. Cl.
| | | |
|---|---|---|
| *G01R 33/422* | (2006.01) | |
| *G01R 33/36* | (2006.01) | |
| *G01R 33/28* | (2006.01) | |
| *G01R 33/34* | (2006.01) | |
| *G01R 33/3415* | (2006.01) | |

(52) U.S. Cl.
CPC .......... *G01R 33/422* (2013.01); *G01R 33/3685* (2013.01); *G01R 33/283* (2013.01); *G01R 33/3415* (2013.01); *G01R 33/34046* (2013.01)

(58) Field of Classification Search
CPC ............... G01R 33/283; G01R 33/422; G01R 33/3415; G01R 33/3685; G01R 33/34046
See application file for complete search history.

(56) References Cited

U.S. PATENT DOCUMENTS

| | | | | |
|---|---|---|---|---|
| 6,482,222 | B1 * | 11/2002 | Bruckheimer et al. | ....... 606/200 |
| 6,762,606 | B2 * | 7/2004 | Jevtic et al. | ................... 324/318 |
| 6,822,846 | B2 | 11/2004 | Reykowski | |
| 6,943,551 | B2 | 9/2005 | Eberler et al. | |
| 7,164,333 | B2 | 1/2007 | Greim et al. | |
| 7,622,928 | B2 * | 11/2009 | Gauss et al. | ................... 324/322 |
| 7,714,581 | B2 * | 5/2010 | Erickson et al. | ............... 324/322 |
| 7,794,473 | B2 * | 9/2010 | Tessmer et al. | ............... 606/200 |
| 7,912,531 | B1 * | 3/2011 | Chiu et al. | ..................... 600/423 |
| 8,494,620 | B2 * | 7/2013 | Rey | .............................. 600/509 |
| 8,571,632 | B2 * | 10/2013 | Piron et al. | ..................... 600/411 |
| 8,698,665 | B2 * | 4/2014 | Bollenbeck et al. | .......... 341/155 |
| 8,854,042 | B2 * | 10/2014 | Vaughan et al. | ............... 324/318 |
| 8,956,385 | B2 * | 2/2015 | Frimerman | ................... 606/200 |
| 2003/0173099 | A1 | 9/2003 | Reykowski | |
| 2005/0231300 | A1 | 10/2005 | Greim et al. | |
| 2006/0158191 | A1 | 7/2006 | Ludwig et al. | |
| 2007/0026733 | A1 | 2/2007 | Greim et al. | |
| 2008/0100294 | A1 | 5/2008 | Rohling et al. | |

FOREIGN PATENT DOCUMENTS

| | | |
|---|---|---|
| CN | 1290223 A | 4/2001 |
| CN | 101268379 A | 9/2008 |
| DE | 102 11 535 A1 | 10/2003 |
| DE | 10 2004 027 814 A1 | 9/2005 |
| DE | 10 2004 013 424 A1 | 10/2005 |
| DE | 103 14 215 B4 | 11/2006 |
| DE | 102005034914 A1 | 2/2007 |

OTHER PUBLICATIONS

German Office Action dated Feb. 24, 2014 for corresponding German Patent Application No. DE 10 2011 079 596.0 with English translation.
German Office Action dated May 7, 2012 for corresponding German Patent Application No. DE 10 2011 079 596.0 with English translation.
Chinese Office Action for related Chinese Patent Application No. 201210256388.2, mailed Sep. 16, 2015 with English Translation.

* cited by examiner

*Primary Examiner* — Dixomara Vargas
(74) *Attorney, Agent, or Firm* — Lempia Summerfield Katz LLC

(57) ABSTRACT

A local coil for an imaging system includes a sheath current filter and one or more lines run through the sheath current filter.

37 Claims, 8 Drawing Sheets

INTEGRATED SHEATH CURRENT FILTER IN A LOCAL COIL

This application claims the benefit of DE 10 2011 079 596.0, filed on Jul. 21, 2011.

BACKGROUND

The present embodiments relate to a sheath current filter and a local coil with a sheath current filter.

Magnetic resonance devices (MR devices) for examining objects or patients using magnetic resonance tomography are known, for example, from DE10314215B4.

In nuclear magnetic resonance tomography, high frequency (HF) coils (e.g., local coils) are used to receive alternating magnetic fields. In order to maintain a good signal-to-noise ratio, the geometry and receive profile of HF coils are optimized for different regions of the body. To obtain the highest possible signal-to-noise ratio, the local coils are positioned as closely as possible on the patient's body. Local coils are, for example, embodied as pure receiving coils (e.g., the spins are excited with a separate transmitting coil, the whole-body resonator). For patient monitoring or for importing audio or video signals (e.g., for display for the patient in a head coil), external lines are led to the patient (e.g., into a head coil).

In the transmission phase of the MRT, the E and B fields induce HF currents on the lines of the probes, headphones or visual displays. The HF currents on the supply lines are known as sheath currents. Unwanted HF currents may result in image interference and malfunctions and the endangerment of the patient. Therefore, either the supply lines have very high impedance or chokes. In the case of shielded lines, sheath current filters (SCFs), are inserted to suppress high-frequency currents on conductors. The sheath current filter and chokes represent high impedance for an HF wave and hence suppress the HF current on the line. Although high-impedance lines may be used to receive signals, the high-impedance lines are very susceptible to interference. The lines may not to be high-impedance for the transmission of videos or acoustic signals. In this case, several chokes may be inserted, for example, in each individual line to suppress HF currents. A plurality of individual lines may be combined with a common conductive shield to form one large cable. This line is wound up to form a cylindrical coil and brought to resonance with a capacitor. The high impedance of the parallel resonance prevents the propagation of a sheath current on the outer jacket of the line. Again, a plurality of sheath current filters is connected in series.

SUMMARY AND DESCRIPTION

The present embodiments may obviate one or more of the drawbacks or limitations in the related art. For example, a sheath current filter is integrated for external supply lines in a local coil in an optimal manner.

A sheath current filter may be installed in a local coil (e.g., fixed at the head end in a head coil). The sheath current filter may be embodied such that the signaling lines may be guided through the sheath current filter. The sheath current filter may be coupled to the signaling lines in a purely inductive way (e.g., in a contact-free manner). The sheath current filter may be enclosed or separable. In the case of an enclosed sheath current filter (SCF), an adapter may be used. A separable SCF enables a simpler introduction of the lines. In this way, no special effort is required for signaling lines to suppress HF currents. Any type of electrically conductive wires may be used. If chokes and SCFs are omitted, lines may be embodied as relatively thin and hence flexible. Lines may be shielded, twisted or may include a parallel-wire line.

DETAILED DESCRIPTION OF THE DRAWINGS

Figure 13:
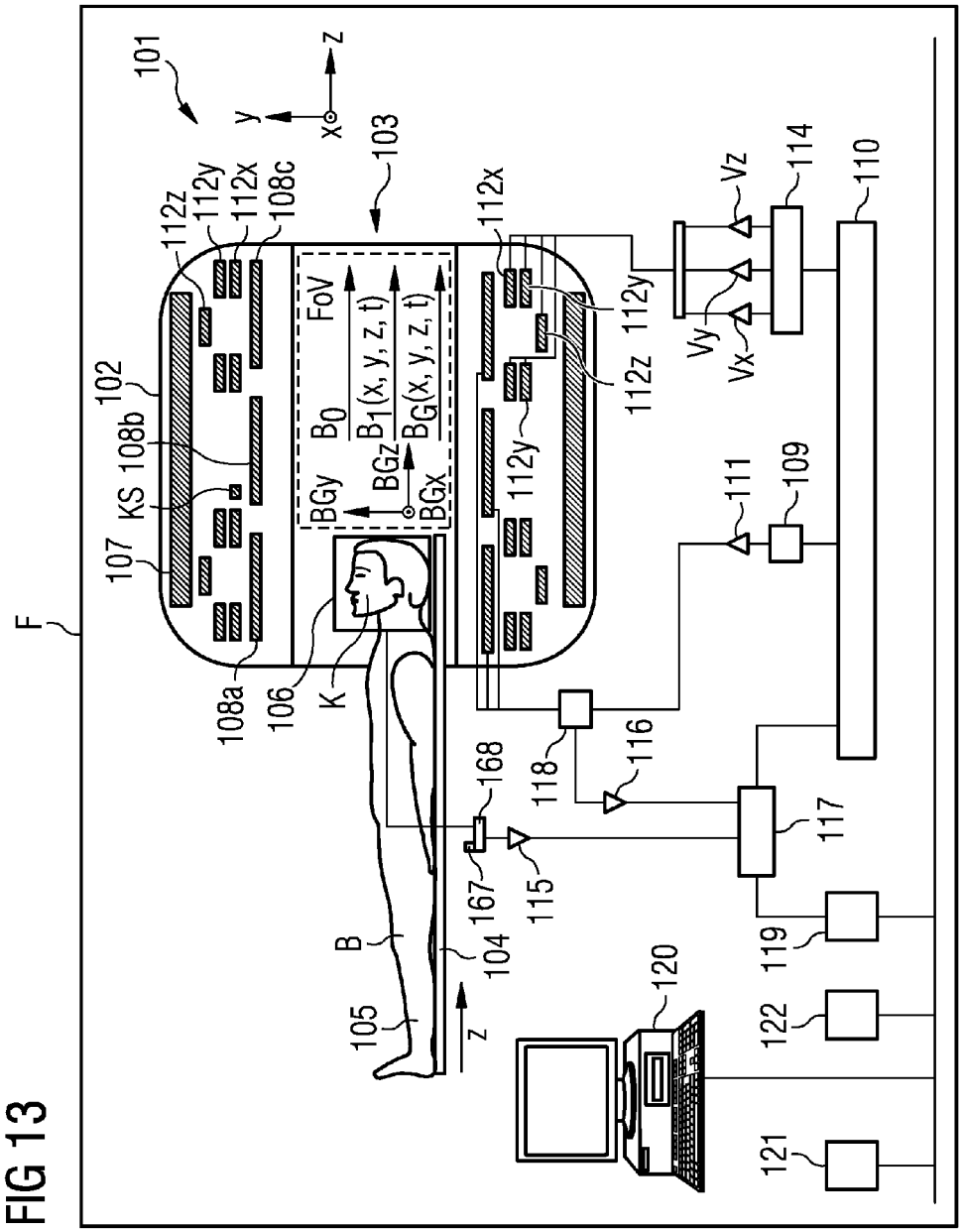
FIG. 13 shows a schematic view of one embodiment of an MRT system.

FIG. 13 shows an imaging magnetic resonance device MRT 101 (e.g., located in a shielded room or Faraday cage F) with a whole-body coil 102 with, for example, a tubular chamber 103, into which a patient bed 104 with a body of, for example, an examination object 105 (e.g., a patient; with or without local coil arrangement 106) may be moved in the direction of the arrow z in order to generate images of the patient 105 using an imaging procedure. Arranged on the patient is a local coil arrangement 106, with which images may be generated in a local area (e.g., a field of view (FOV)) of the MRT 101 of a partial region of the body 105 in the FOV. Signals from the local coil arrangement 106 may be evaluated by an evaluation device (e.g., including elements 168, 115, 117, 119, 120, 121) of the MRT 101 that may be connected, for example, by a coaxial cable or by radio (e.g., element 167) to the local coil arrangement 106 (e.g., converted into images, stored or displayed).

In order to examine a body 105 (e.g., an examination object or a patient) with a magnetic resonance device MRT 101 using magnetic resonance imaging, different magnetic fields, the temporal and spatial characteristics of which are matched as closely as possible, are radiated onto the body 105. A powerful magnet (e.g., a cryomagnet 107) in a measuring cabin with a, for example, tunnel-shaped opening 103, generates a static strong main magnetic field B0 of, for example, 0.2 Tesla to 3 Tesla or more. A body 105 to be examined is supported on a patient bed 104 and moved into a region of the main magnetic field B0 that is approximately homogenous in the FOV. Nuclear spins of atomic nuclei of the body 105 are excited via magnetic high-frequency excitation pulses B1 (x, y, z, t) that are radiated using a high-frequency antenna shown in FIG. 13 as a body coil 108 (e.g., a multipart body coil 108a, 108b, 108c) in a very simplified form (and/or optionally a local coil arrangement). High-frequency excitation pulses are generated, for example, by a pulse generation unit 109 that is controlled by a pulse sequence control unit 110. After amplification by a high-frequency amplifier 111, the pulses are routed to the high-frequency antenna 108. The high-frequency system shown in FIG. 13 is only indicated schematically. In other embodiments, more than one pulse generation unit 109, more than one high-frequency amplifier 111, and a plurality of high-frequency antennae 108 a, b, c are used in a magnetic resonance device 101.

The magnetic resonance device 101 also includes gradient coils 112x, 112y, 112z, with which magnetic gradient fields are radiated during a measurement for selective slice excitation and for local encoding of the measuring signal. The gradient coils 112x, 112y, 112z are controlled by a gradient coil control unit 114 that is connected to the pulse sequence control unit 110.

Signals emitted by the excited nuclear spins of the atomic nuclei in the examination object are received by the body coil 108 and/or at least one local coil arrangement 106, amplified by assigned high-frequency preamplifiers 116, and further processed and digitized by a receive unit 117. The recorded measurement data are digitized and stored as complex numerical values in a k-space matrix. An associated MR image may be reconstructed using a multidimensional Fourier transformation from the k-space matrix occupied by values.

With a coil that may be operated in both transmit and receive mode (e.g., the body coil 108 or a local coil 106), the correct signal forwarding is regulated by an upstream transmit-receive switch 118.

An image processing unit 119 generates an image from the measurement data. The image is displayed to a user on an operating console 120 and/or stored in a memory unit 121. A central processing unit 122 controls the individual system components.

In MR tomography, images with a high signal-to-noise ratio (SNR) may be recorded by local coil arrangements (e.g., coils, local coils). The local coil arrangements are antenna systems that are attached in the immediate vicinity on top (anterior), under (posterior), on, or in the body 105. During an MR measurement, the excited nuclei induce a voltage in the individual antennae of the local coil. The induced voltage is amplified by a low-noise preamplifier (e.g., LNA, preamp) and forwarded to the receive electronics. To improve the signal/noise ratio, even with high-resolution images, high-field systems (e.g., 1.5 T-12 T or more) are used. If more individual antennae may be connected to an MR receive system than receivers are present, a switching matrix (e.g., RCCS), for example, is installed between the receive antennae and receivers. The switching matrix routes the currently active receive channels (e.g., the receive channels present in the FOV of the magnet at the time) to the receivers present. This allows more coil elements to be connected than there are receivers present, since, for whole body coverage, only the coils present in the FOV or in the homogeneity volume of the magnet, for example, are to be read out.

A local coil arrangement 106 may be used, for example, to describe an antenna system. The local coil arrangement 106 may include, for example, one antenna element or, as an array coil, a plurality of antenna elements (e.g., coil elements). The individual antenna elements are, for example, embodied as loop antennae (loops), butterfly coils, flex coils, or saddle coils. A local coil arrangement includes, for example, coil elements, a preamplifier, further electronics (e.g., sheath current filters), a housing, and supports. The local coil arrangement may include a cable with a plug, by which the local coil arrangement is connected to the MRT system. A receiver 168 attached to the system side filters and digitizes a signal received by radio, for example, by a local coil 106 and transfers the data to a digital signal processing device. The digital signal processing device may derive an image or a spectrum from the data obtained from a measurement and make the image or the spectrum available to the user (e.g., for subsequent diagnosis and/or for storage).

FIGS. 1-12 show examples and details of exemplary embodiments.

Figure 1:
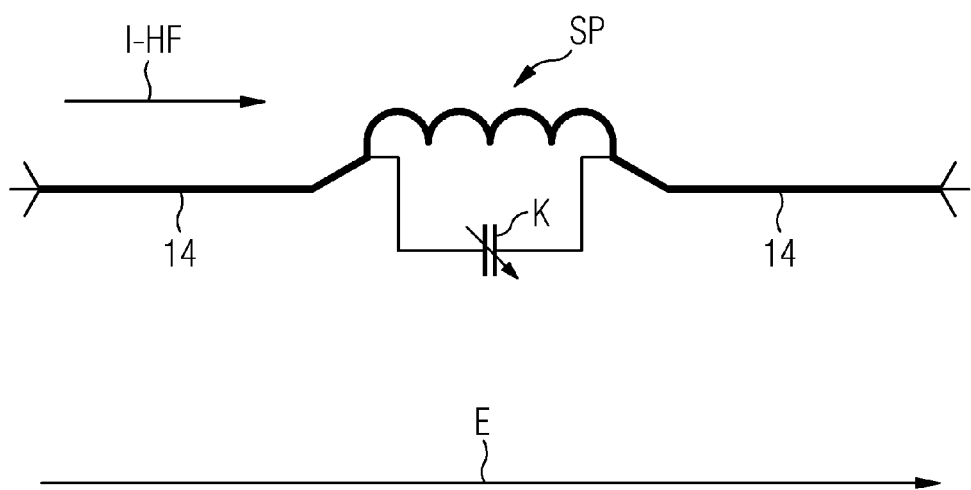
FIG. 1 illustrates the principle of a sheath current filter.

FIG. 1 shows the principle of a sheath current filter. A signal is transmitted over a (signaling) line 14 located in an E field E. In the center of FIG. 1, the line 14 is wound up in a partial region of the line 14 to form a coil SP, forming an oscillating circuit with, for example, an adjustable capacitor K connected in parallel to the oscillating circuit, by which the transmission of a current I-HF generated by the (alternating) field E in the line 14 in longitudinal direction of the line 14 is prevented or reduced.

Figure 2:
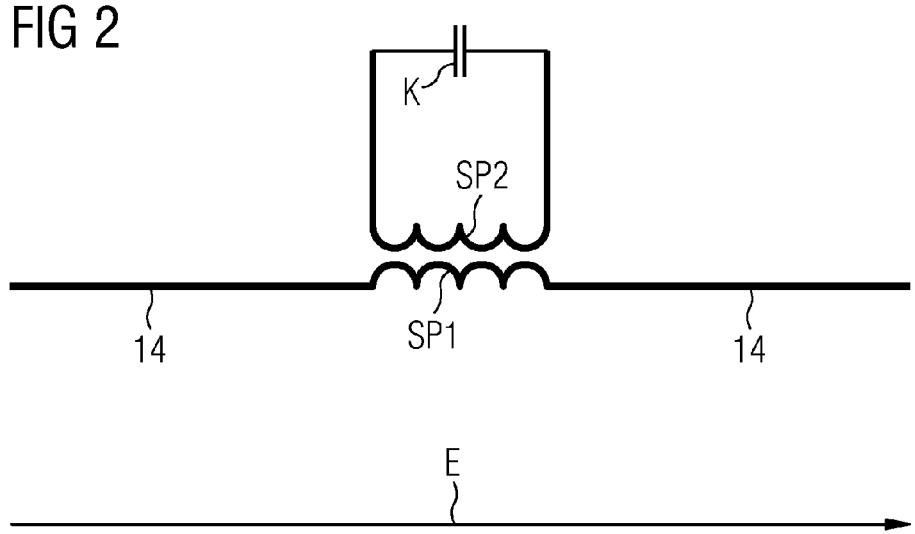
FIG. 2 shows one embodiment of an inductively coupled sheath current filter.

FIG. 2 shows the principle of an inductively coupled sheath current filter (SCF). A signal is transmitted via a line 14 located in an E field E. The line 14 includes a first coil SP1 (in the center in FIG. 2) coupled to a further coil SP2 (in FIG. 2, located above the first coil), which forms with, for example, an adjustable capacitor K an oscillating circuit that prevents or reduces the transmission of a current generated by the (alternating) field E in the line in the longitudinal direction of the line 14.

Figure 3:
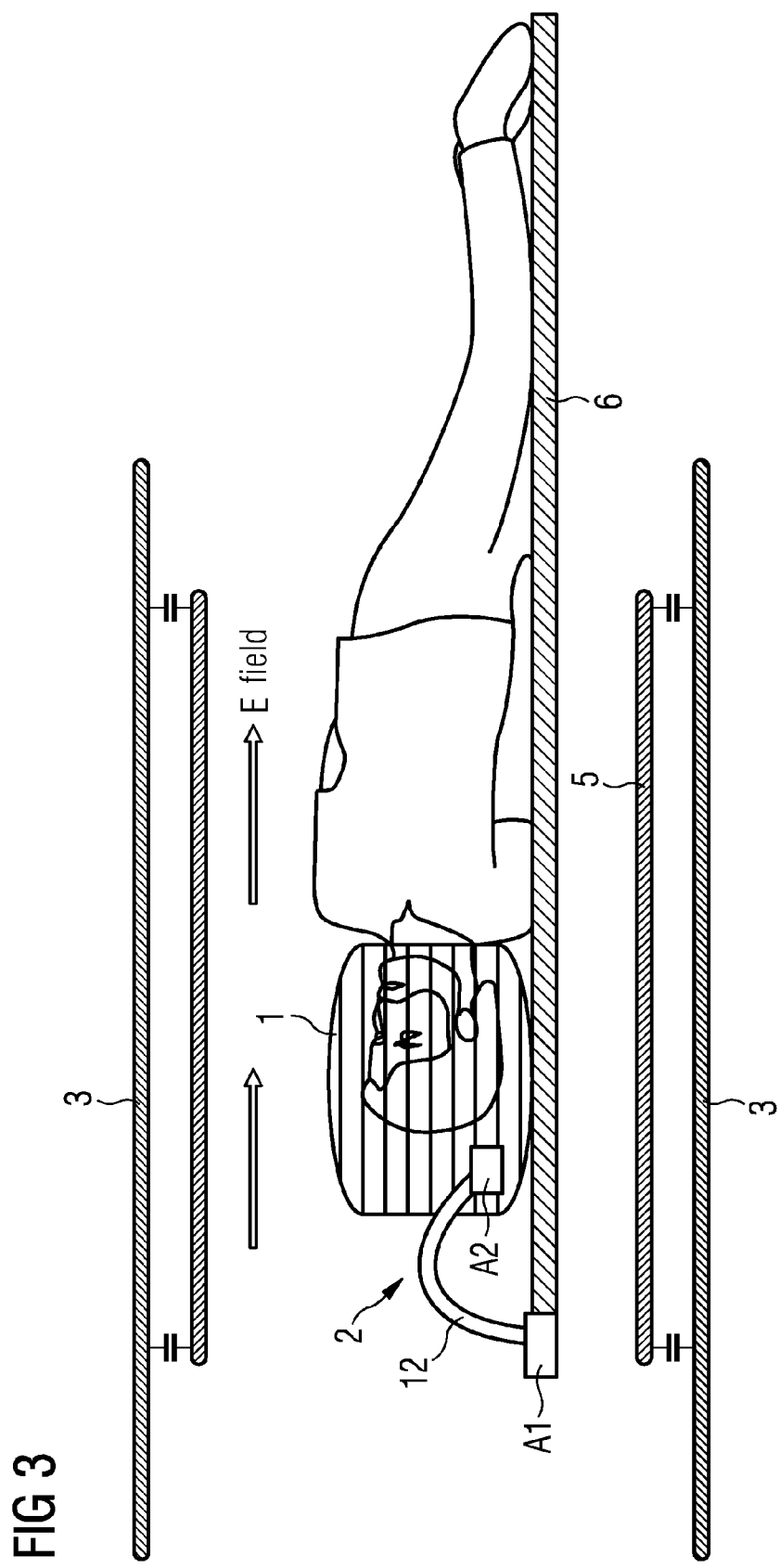
FIG. 3 shows an exemplary position of a head coil in a magnetic resonance tomography (MRT) system.

FIG. 3 shows the position of a local coil 1 (e.g., of a head coil with the shape of a helmet) over the head of a patient lying in an MRT system on a patient bed 6. A supply line 2 (e.g., including one or more lines 12) extends from a connection A1 (e.g., on the patient bed 6) through a connection A2 (e.g., outlet, socket, plug) on the housing through the housing of the head coil 1 into the interior of the head coil 1. The whole-body coil 5 of the MRT system is shielded from the environment by a copper shield 3 outside the FOV.

Figure 4:
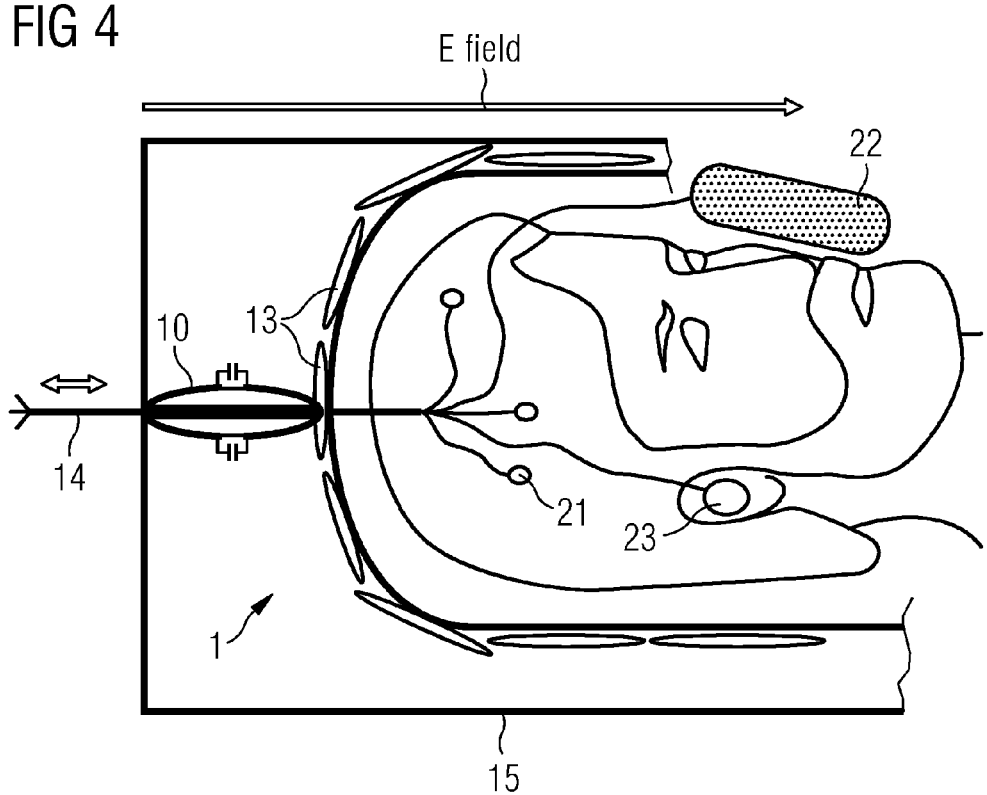
FIG. 4 shows one embodiment of a sheath current filter in a head coil at a head end.
Figure 5:
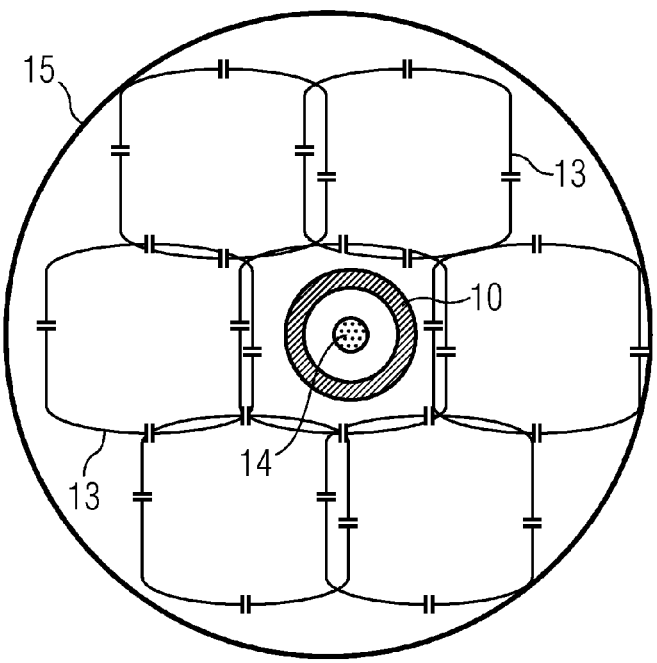
FIG. 5 shows one embodiment of a sheath current filter at the head end of a head coil arranged centrally between antennae in the head coil.

FIG. 4 and FIG. 5 are examples of where a sheath current filter 10 may be arranged in a head coil 1.

In FIG. 4, the sheath current filter 10 sits at the head end of the head coil 1 (e.g., enclosed, furthest from the foot) and, as shown in FIG. 5, centrally between the (receive) antennae 13 (e.g., for the reception of the signals emitted from the patient in MRT during an examination) of the head coil 1.

FIG. 4 also shows an image display device 22 for displaying a video with instructions or light-entertainment films for the patient, a headphone 23 for sound insulation and/or for playing back music/instructions for the patient, and electrodes 21 that may be attached to the patient.

The image display device 22 and/or headphone 23 and/or electrodes 21 may also be connected via external lines or via the connection A1 in the patient bed, which route lines 14 together with the received signals from the local coil 1 for evaluation to the MRT 117.

In one embodiment, the external lines do not run via A1, and the signal lines of coil 12 do not run through SCF 10. The line 14, however, may be directed out of the plug A1.

Figure 6:
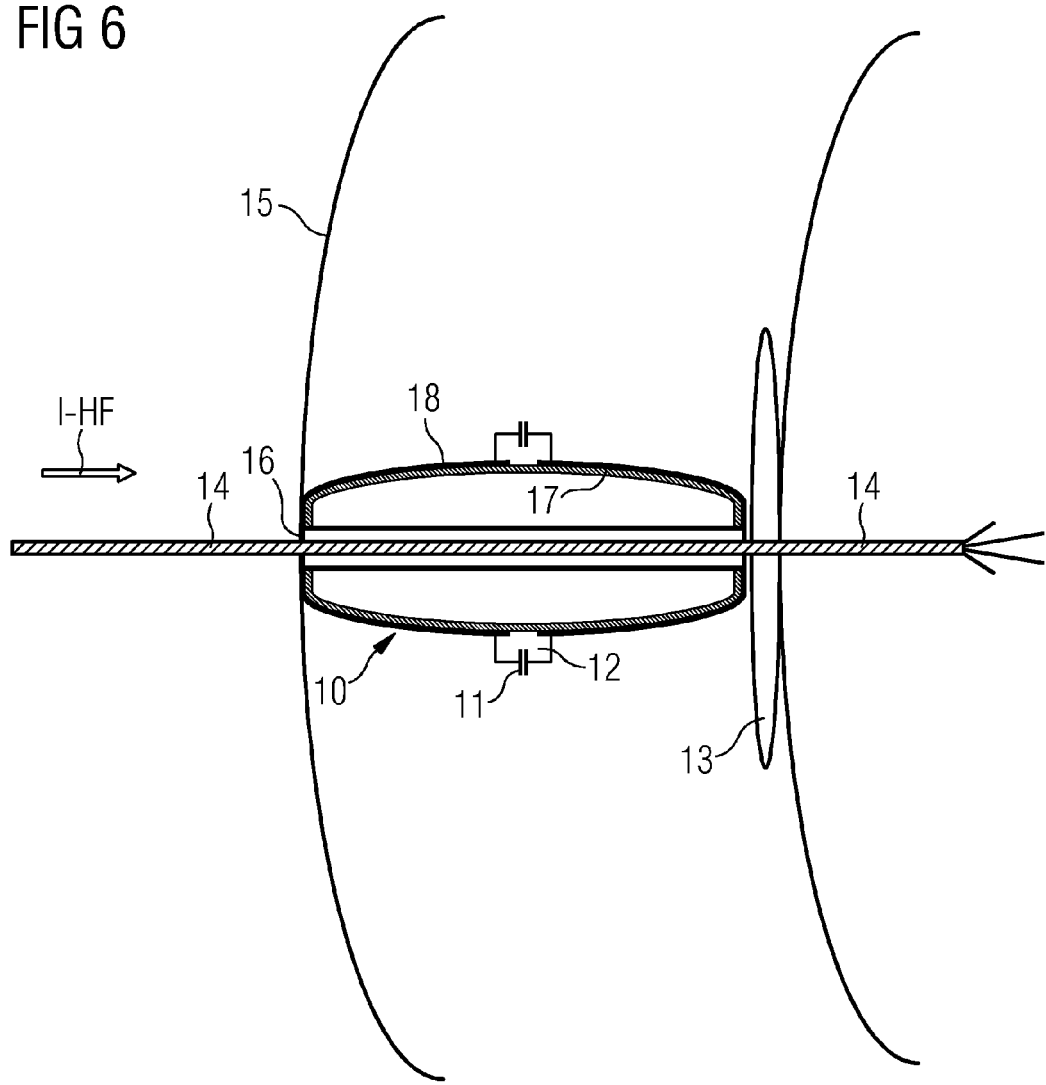
FIG. 6 shows an enlarged arrangement similar to that in FIG. 4, with signal lines running centrally through a coil element of the local coil.

FIG. 5, as a top view, and FIG. 6, as a longitudinal section, are enlarged views of an arrangement of a sheath current filter 10 in a local coil similar to that in FIG. 4. The signaling lines 14 may be guided through the center of a coil element 13 of the local coil 1. In FIG. 6, the sheath current filter 10 is located in the housing of a local coil (e.g., between the outside and the inside of the housing) lying on and/or integrated with openings 16 on the outside and inside of the local coil. The signaling lines 14 may extend through the openings.

The sheath current filter 10 is embodied as a shortened quarter-wave (λ/4) balun. This includes a plastic carrier 17 metalized with a copper layer 18. In the opening 16, through which the signaling lines 14 may be laid, the copper layer is continuous or intermittent. In the center of the external copper layer, there is an interruption 12 (also shown, for example, in FIG. 8), in the form of a gap surrounding the external metallic layer. The gap 12 is bridged by capacitors 11. The capacitors 11 are selected such that the capacitors 11 form an electrical resonant circuit. The resonance frequency of the capacitors 11 is, for example, the same as the working frequency of the MRT system. The sheath current filter may be capable of resonance. The number of signaling lines brought through has no influence on the resonant frequency.

Figure 7:
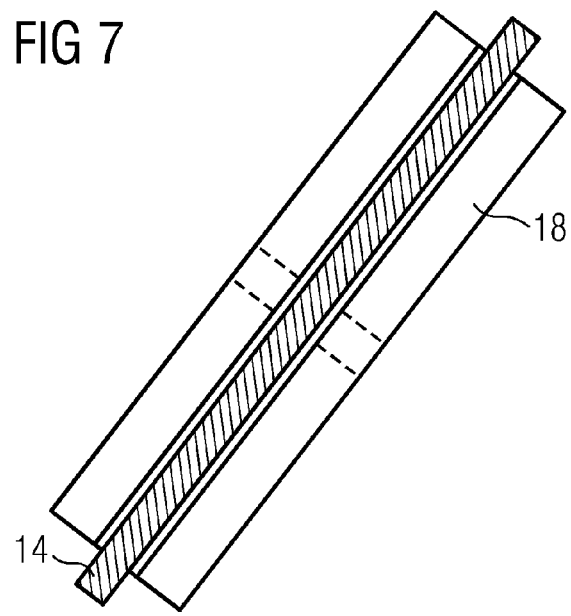
FIG. 7 shows an exemplary cable lying in a lower part of a sheath current filter.

FIG. 7 shows, by way of example, a lower part U of the sheath current filter 10, in which cables 14 may lie. FIG. 7 also shows an electrically conductive coating 18 made, for example, of copper or another material with good electrical conductivity on the outside of the sheath current filter 10.

A sheath current filter 10 may include a plurality of parts O, U that may be removed from each other and reassembled again.

Figure 8:
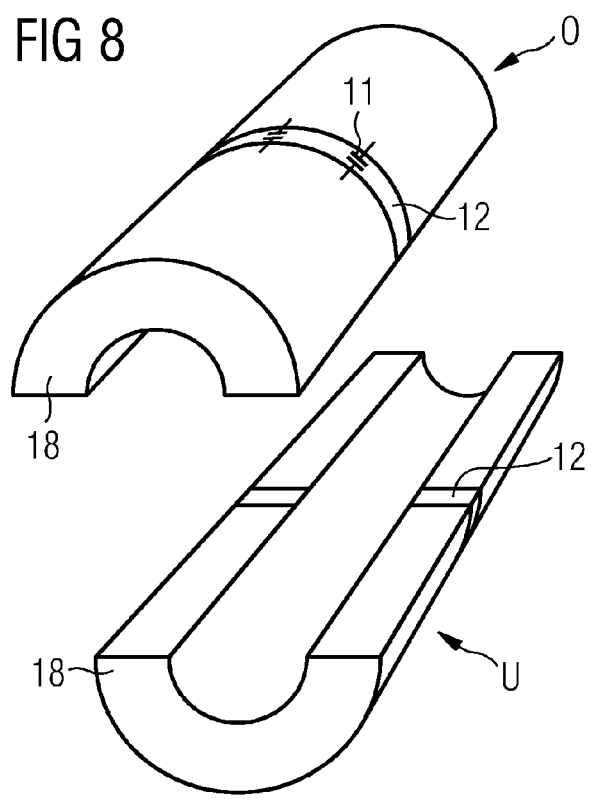
FIG. 8 shows a perspective view of an upper part and a lower part of one embodiment of a separable sheath current filter.

FIG. 8 shows by way of example, a perspective view of an upper part O and a lower part U of a sheath current filter 10 that may be separated into two parts. FIG. 8 also shows a gap 12 going round the sheath current filter in the circumferential direction on the external metallic metal coating of the sheath current filter. One or a plurality of capacitors (e.g., shortening capacitors) 11 is arranged in the gap 12.

Figure 9:
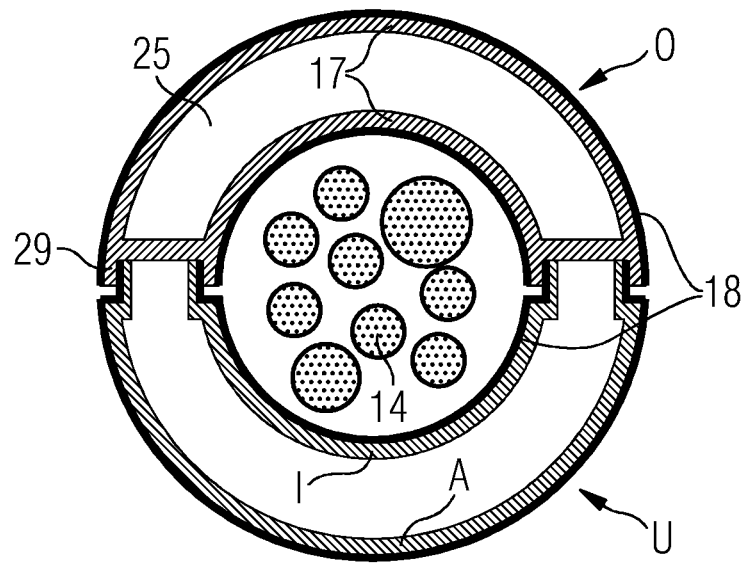
FIG. 9 shows a cross section through one embodiment of a sheath current filter.
Figure 10:
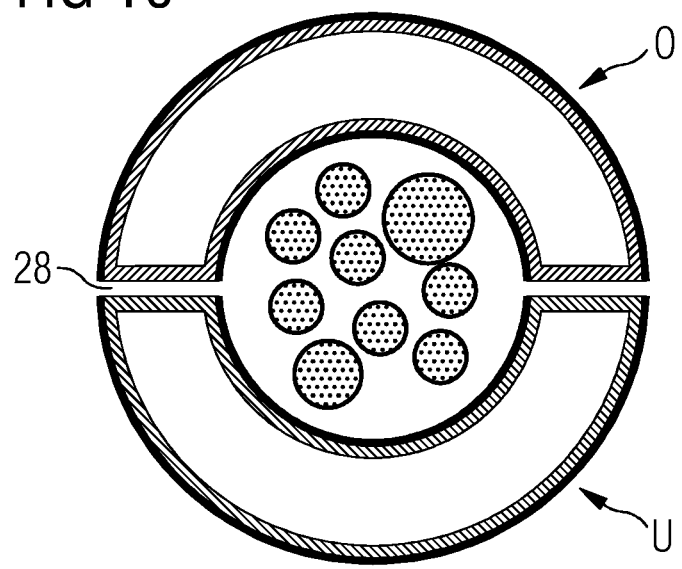
FIG. 10 shows a cross section through another embodiment of a sheath current filter.
Figure 11:
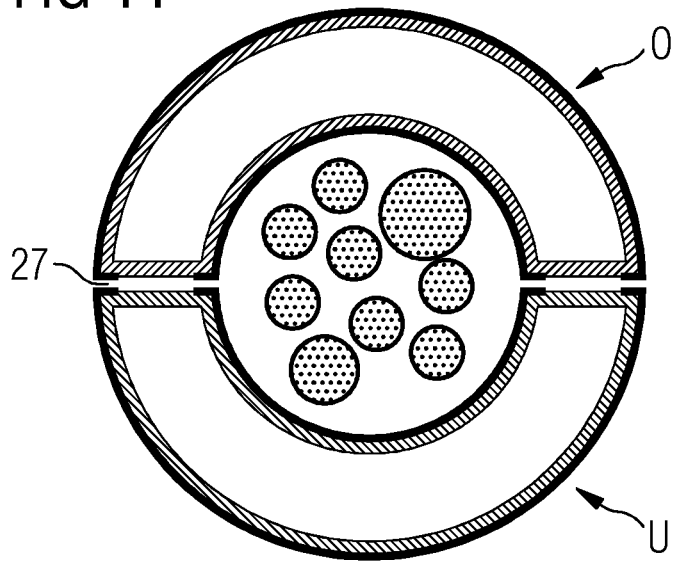
FIG. 11 shows a cross section through yet another embodiment of a sheath current filter.
Figure 12:
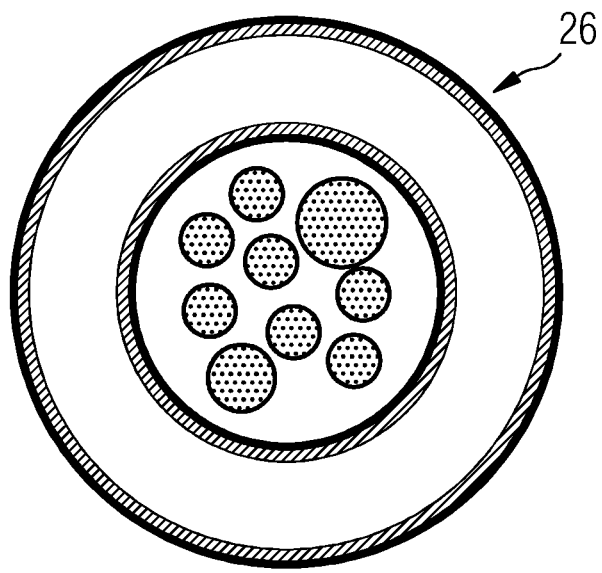
FIG. 12 shows a cross section through one embodiment of a sheath current filter.

FIGS. 9-11 each show cross sections through an embodiment of a sheath current filter 10, and FIGS. 9-11 show both an upper part O and a lower part U of a sheath current filter 10 that may be separated into two parts. FIG. 12 shows a cross section through a one-piece sheath current filter 10 that may not be separated into two parts.

In the exemplary embodiment shown in FIG. 9, the separability of the sheath current filter 10 into two parts O, U is achieved without detriment to the barrier effect or the electromagnetic shielding. The magnetic flux is not impeded, and the overlapping of the two parts O, U provides that the shielding is very good.

According to FIG. 9, the copper coating of the lower part U penetrates the coating 18 of the upper part O (e.g., there is an overlap at the dividing point).

In the exemplary embodiment shown in FIG. 10, the SCF 10 is separable. The half shells O, U only meet or lie against each other in the form of a butt connection. An air gap 28 (e.g., a small air gap) may be provided between the upper part O and the lower part U.

In the exemplary embodiment shown in FIG. 11, when the half shells O, U are brought together, the copper coatings are in electrical connection with each other by, for example, contact or interlocking.

In the exemplary embodiment shown in FIG. 12, the SCF 10 is enclosed (e.g., the upper part O and the lower part U are firmly connected to each other).

In the exemplary embodiments, the sheath current filter 10 may have a hollow space 25 between an outer shell of the sheath current filter 10 and an inner shell of the sheath current filter 10, or the hollow space 25 may also be completely or partially filled in.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for an imaging system, the local coil comprising:
a sheath current filter; and
one or more signal lines that run through the sheath current filter,
wherein at least one of the signal lines runs from outside of the local coil into an interior of the local coil through the sheath current filter.

2. The local coil as claimed in claim 1, wherein the sheath current filter is within the imaging system, the imaging system comprising a magnetic resonance tomography (MRT) system.

3. The local coil as claimed in claim 1, wherein the one or more signal lines are insulated from the sheath current filter in an electrically non-conductive manner, are inductively coupled to the sheath current filter, or a combination thereof.

4. The local coil as claimed in claim 3, wherein the one or more signal lines are electrically insulated from oscillating circuits of the sheath current filter and are inductively coupled to the oscillating circuits.

5. The local coil as claimed in claim 1, wherein the sheath current filter is located on or completely or partially in a housing of the local coil between an inner surface of the housing facing a patient and an outer surface of the housing facing the imaging system.

6. The local coil as claimed in claim 1, wherein the one or more lines are one or more signaling lines.

7. The local coil as claimed in claim 1, wherein a circumferentially continuous, uninterrupted, or circumferentially continuous and uninterrupted conductive layer, through which the signal lines are run is provided on an opening of the sheath current filter.

8. The local coil as claimed in claim 7, wherein the circumferentially continuous, uninterrupted, or circumferentially continuous and uninterrupted conductive layer is a copper layer.

9. The local coil as claimed in claim 1, wherein the one or more signal lines are connected to a loudspeaker/headphone, a display, electrodes, receive coils, or a combination thereof inside the local coil.

10. The local coil as claimed in claim 1, wherein the local coil is a magnetic resonance tomography (MRT) head coil.

11. The local coil as claimed in claim 1, wherein the sheath current filter is arranged on a head end of the local coil.

12. The local coil as claimed in claim 1, wherein a housing of the sheath current filter is uninterrupted, enclosed, or uninterrupted and enclosed along a circumference.

13. The local coil as claimed in claim 12, wherein the circumference is a circumference around a z direction.

14. The local coil as claimed in claim 1, wherein the sheath current filter comprises at least two parts that are operable to be taken apart and reassembled again.

15. The local coil as claimed in claim 14, wherein a housing of the sheath current filter comprises the at least two parts.

16. The local coil as claimed in claim 1, wherein the one or more signal lines are shielded, twisted, a parallel wire line, or a combination thereof.

17. The local coil as claimed in claim 1, wherein the sheath current filter comprises a shortened quarter-wave balun.

18. The local coil as claimed in claim 1, wherein the sheath current filter comprises a coated plastic carrier with a conductive layer.

19. The local coil as claimed in claim 18, wherein the conductive layer is a copper layer.

20. The local coil as claimed in claim 1, wherein the sheath current filter comprises a plastic carrier coated with a conductive layer.

21. The local coil as claimed in claim 20, wherein the conductive layer is a copper layer on an inside, an outside, or the inside and the outside of the plastic carrier.

22. The local coil as claimed in claim 1, wherein a conductive layer on the outside of the sheath current filter comprises an interruption.

23. The local coil as claimed in claim 22, wherein the interruption is in a longitudinal direction approximately in the center.

24. The local coil as claimed in claim 1, wherein a copper layer on the outside of the sheath current filter comprises an interruption bridged by one or more capacitors.

25. The local coil as claimed in claim 1, wherein capacitors of the sheath current filter form an electrical resonant circuit, wherein a resonant frequency of the capacitors is a working frequency of the imaging system, or a combination thereof.

26. The local coil as claimed in claim 1, wherein a resonant frequency of the sheath current filter is not influenced by the number of the one or more signal lines guided through the sheath current filter.

27. The local coil as claimed in claim 1, wherein the sheath current filter is separable into at least two parts.

28. The local coil as claimed in claim 27, wherein the at least two parts are combined parts with uninterrupted shielding of the sheath current filter.

29. The local coil as claimed in claim 27, wherein when the at least two parts abut each other, a conductive layer of one part of the at least two parts and a conductive layer of another part of the at least two parts are connected to each other in an electrically conductive manner.

30. The local coil as claimed in claim 1, wherein the sheath current filter is separable into at least two parts with shielding that overlaps in a combined condition of the at least two parts.

31. The local coil as claimed in claim 1, wherein the sheath current filter is separable into two half shells that abut each other.

32. The local coil as claimed in claim 31, wherein the sheath current filter is separable into the two half shells that abut each other with an air gap between the two half shells.

33. The local coil as claimed in claim 1, wherein the sheath current filter is enclosed.

34. The local coil as claimed in claim 33, wherein the sheath current filter is enclosed with an upper part and a lower part that are firmly connected to each other.

35. The local coil as claimed in claim 1, wherein an attachment device for the one or more signal lines is provided at one end or both ends of the one or more signal lines.

36. The local coil as claimed in claim 35, wherein the attachment device comprises a socket or a plug.

37. The local coil as claimed in claim 1, wherein the one or more signal lines run on one side to a connector on a patient bed, and run into the local coil on the other side with or without interruption through a plug-in connection.

* * * * *